United States Patent [19]

Schörnig

[11] 4,349,932
[45] Sep. 21, 1982

[54] DEVICE FOR UNIFORMLY PRESSING ON AND RELEASING THE PRESSURE FROM RUB-OUT BARS

[75] Inventor: Eberhard Schörnig, Taunusstein, Fed. Rep. of Germany

[73] Assignee: Hoechst Aktiengesellschaft, Fed. Rep. of Germany

[21] Appl. No.: 254,450

[22] Filed: Apr. 15, 1981

[30] Foreign Application Priority Data

Apr. 18, 1980 [DE] Fed. Rep. of Germany ... 8010663[U]

[51] Int. Cl.$^3$ ............................................. G03D 5/06
[52] U.S. Cl. ......................................... 15/77; 15/102; 354/317
[58] Field of Search ............................ 15/77, 88, 102; 354/297, 317, 319

[56] References Cited

U.S. PATENT DOCUMENTS 4,206,527 6/1980 Diels et al. .............................. 15/102

FOREIGN PATENT DOCUMENTS 2259395 6/1974 Fed. Rep. of Germany .......... 15/77

425704 3/1975 U.S.S.R. ................................ 15/102

Primary Examiner—Edward L. Roberts
Attorney, Agent, or Firm—James E. Bryan

[57] ABSTRACT

This invention relates to an improvement in a device for uniformly pressing on and releasing the pressure from, particularly oscillating, rub-out bars in an apparatus for developing printing plates including transport rolls and, if appropriate, squeezing rolls arranged in pairs, particularly in a horizontal position, with a bearing at each end of each upper roll, and means whereby each bearing and upper roll may be raised and lowered with respect to each lower roll, the improvement comprising pivotal angle lever means, equipped with weight means, and having a lower arm with a pressure roll connected to the end thereof, the pressure roll being adapted to exert pressure on a rub-out bar in the lowered position of each upper roll, and lifting means for the angle lever means comprising bearing means adapted to seat on shaft means of the upper rolls, and connecting means between the bearing means and an upper arm of the pivotal angle lever means.

4 Claims, 3 Drawing Figures

DEVICE FOR UNIFORMLY PRESSING ON AND RELEASING THE PRESSURE FROM RUB-OUT BARS

This invention relates to a device for uniformly pressing on and releasing the pressure from rub-out bars, particularly from oscillating rub-out bars, which are installed in an apparatus for developing printing plates comprising transport rolls and, if appropriate, squeezing rolls arranged in pairs, particularly in a horizontal position, with a bearing being disposed at each end of each upper roll, which bearing may be raised and lowered with respect to the lower roll.

From U.S. Pat. No. 4,206,527, it is known to provide a forked head each having an upper and a lower arm for engaging bearings, with a swivel shaft extending parallel to the direction of transport of printing plates. The upper arm of the forked head, via a toggle lever arrangement, exerts a pressure from above upon the bearing when the latter is in the lowered position, whereas the lower arm of the forked head raises the bearing and supports the latter when it is in the raised position. For actuation, each toggle lever arrangement is, via an adjusting element comprising two forked heads and a turn-buckle swivel, linked with a rotatable control shaft common to all toggle lever arrangements and also extending parallel to the direction of transport of the printing plates, which is installed on each pair of transport rolls and, if appropriate, on each pair of squeezing rolls. For the treatment of the surfaces of the printing plates, oscillating rub-out brush and plush bars for example may be employed. The bars are pressed down by toggle levers which can be individually actuated, or they are combined with resilient guide tables for the plates. It has proved disadvantageous, however, that for unloading these bars, which is necessary in case of a longer standstill period, a number of various levers have to be operated, for which purpose the casing of the apparatus has to be opened. Another disadvantage is the fact that the pressure exerted upon the brush and plush bars is too strong in general, as it is not always possible to achieve an exact adjustment of the toggle levers. Further, a constant pressure over the whole service life of the bars can be obtained only by repeated readjustments, and it also occurs that the adjustment of the toggle levers changes due to oscillating movements, which may even lead to a springing open of the toggle levers. Pressures exerted by spring tension or by resiliently supported plate guide tables do not result in constant values, particularly if printing plates of different thicknesses are to be processed. It thus can be stated that it was not possible for the users of the known tightening or, respectively, pressure devices to maintain constant nominal pressures when the plush or brush bars were used over a longer period, or because of unintentional pressure changes.

It is therefore an object of the present invention to provide a device for uniformly pressing on and releasing the pressure from rub-out bars, such as, e.g., brush bars or plush bars, which device avoids the disadvantages described above and wherein, via the adjustment path of the rub-out bars, a pressure is obtained which within a certain adjustment range remains constant, whereby at the same time an uncomplicated handling and thus a low service expenditure is ensured.

In accomplishing this object, an apparatus of the type described above is used, in which apparatus the pressing down of the rub-out bars is effected by a bent lever equipped with slidable weights whose lever arm, via a pivotal pressure roll, acts upon the rub-out bars, and the pressure release movement from the rub-out bars is effected by a raising movement of the shafts of the upper transport roll and upper squeezing roll, by means of a lifting device with a bearing and a longitudinal adjustment device. In a preferred embodiment, the rub-out bars are in the form of at least one brush or plush bar.

In a further embodiment of the invention, it is possible, in addition to releasing the pressure, to raise the rub-out bars by operating the device of this invention. This raising movement is obtained in that for the pressure release movement the pressure rolls are connected with the rub-out bars, by means of a mounting angle.

Thereby, it is achieved that in the operating area the compressive force is distributed linearly, so that its constancy is guaranteed during the whole service life of the rub-out bars, and no readjustment is necessary. By one single operation, the pressure can be released from the rub-out bars, the release movement being deducted from the roll necks via a lever system. Unloading of the rub-out bars is very simple because the unloading process for the rolls is described in the operating instructions of the apparatus. It is therefore no longer possible to omit the unloading step which heretofore had to be carried out separately. In addition, the weights ensure a constant pressure which is essential in order to achieve a uniform treatment of the printing plates, for only in this way is it possible to obtain well-developed printing plates.

A more detailed description of the present invention is given by reference to the accompanying drawings, in which.

Figure 1:
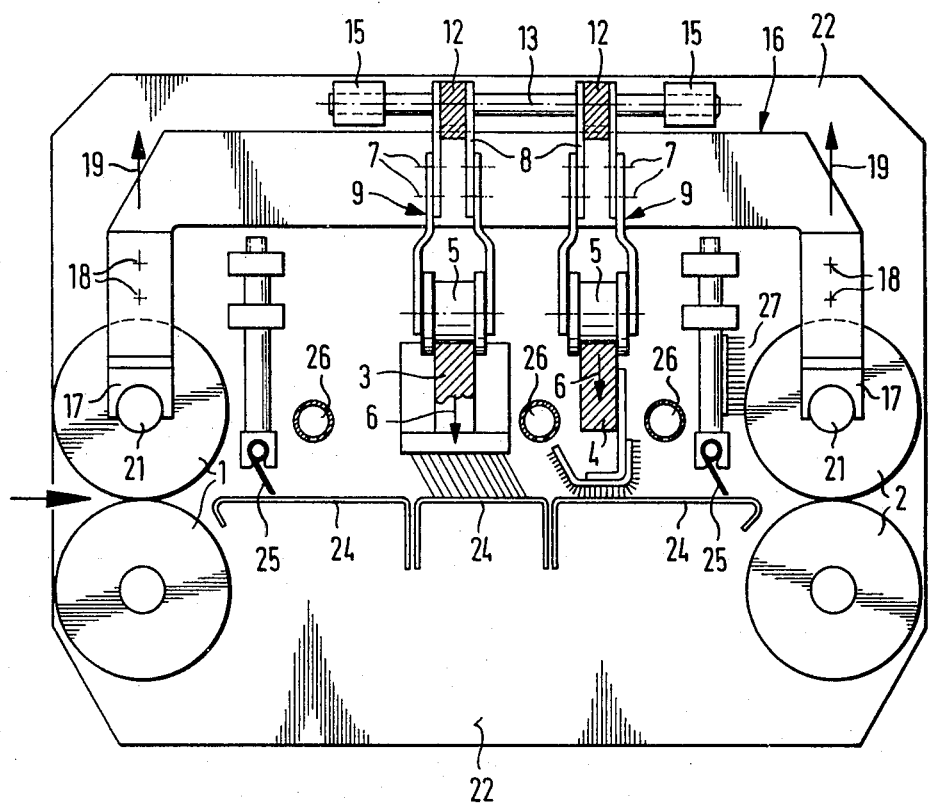
FIG. 1 is a cross-sectional view of one embodiment of the apparatus for developing printing plates.
Figure 2:
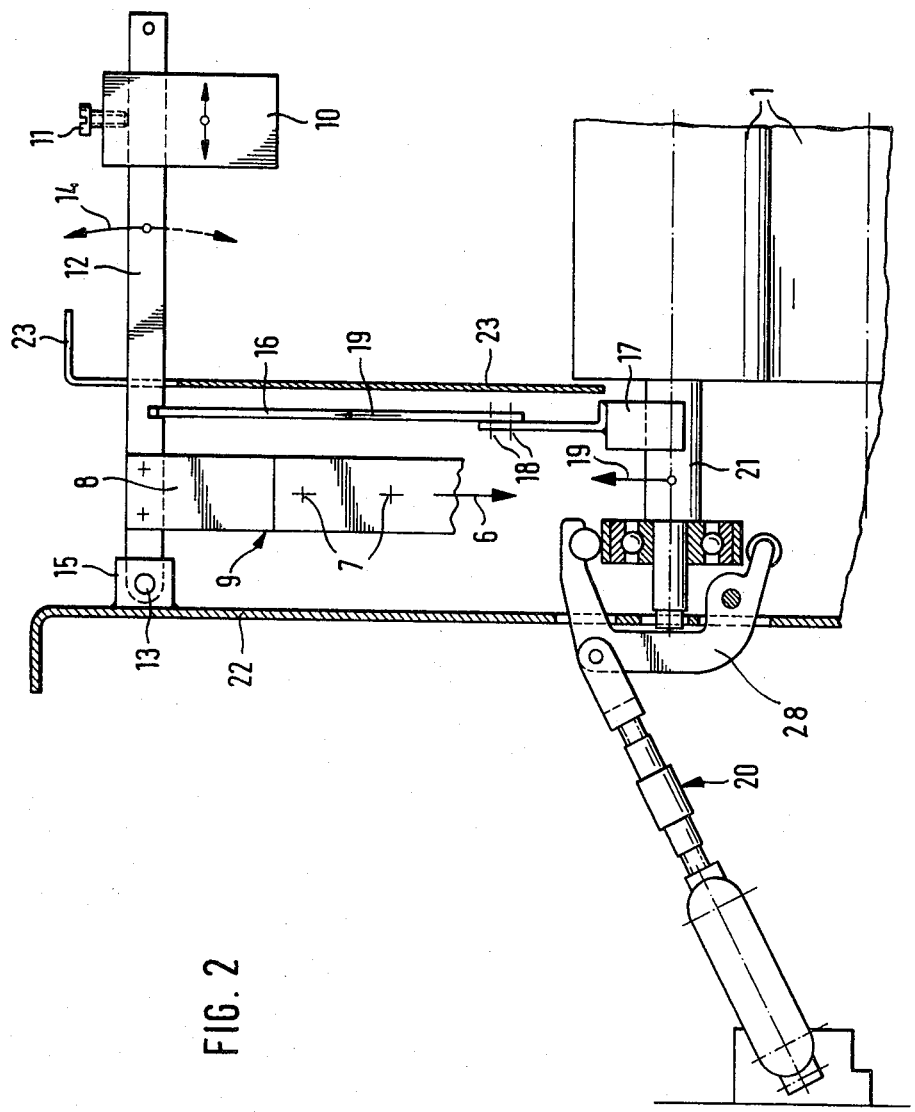
FIG. 2 is a detailed view of an angle lever upon which a weight acts, together with the lifting device.

The printing plate to be processed is conveyed through the apparatus shown in FIG. 1, in the direction indicated by the arrow, whereby it passes the conveying or feeding rolls and the squeezing rolls which are arranged in pairs 1 and 2. Between the two pairs of rolls which are mounted to the side walls of the casing 22, there is the processing zone comprising a tripartite plate guide table 24, doctor blades 25, spray tubes 26 and a roll cleaning plush 27. In this zone there are arranged the loaded and oscillating rub-out bars, in the direction of pressure 6, by means of a pressure device installed at each side of the rub-out bars, which in this illustrative embodiment are shown as brush and plush bars 3 and 4. The pressure device comprises pressure rolls, which preferably are supported by anti-friction bearings, a longitudinal adjustment device 7 for the pressure support 8, a lever arm 9 and—as can be seen from FIG. 2—an adjustable weight 10 with a set screw 11. When being pressed on, the contact pressure rolls 5 exert a pressure on the rub-out bars 3 and 4. The angle lever 9, 12 shown in FIG. 2, can be pivoted around the fulcrum 13 in the direction of the arrow 14. The fulcrum is fixed by two bearing blocks 15.

For releasing the pressure from the rub-out bars 3 and 4, the upward movement 19 of the roll shafts 21 is used, via a lifting device 16 with a bearing 17 and a longitudinal adjustment device 18, in that the angle lever 9, 12 with the weight 10 is raised in the direction of the arrow 14. Thereby the pressure is relieved from the contact pressure rolls 5, or, respectively, from the rub-out bars 3 and 4, as can be seen in FIG. 1, whereby a small gap is produced between the pressure rolls 5 and the rub-out bars 3 and 4.

By actuating the device 28 initiating the roll pressure, via the turnbuckle swivel 20, the roll shafts 21 are lowered. As a consequence, the weight 10 again acts as a compressive force onto the rub-out bars 3 and 4, because simultaneously the lifting device 16 is lowered.

Figure 3:
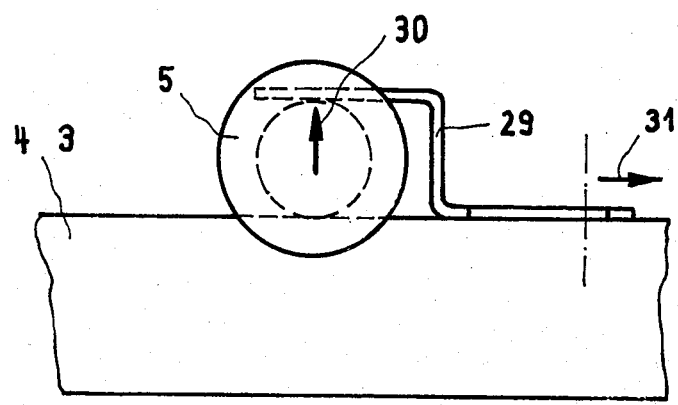
FIG. 3 shows the lifting device for the rub-out bar according to a further embodiment of the invention.

FIG. 3 shows another lifting device, wherein the rub-out bars 3 and 4 are additionally raised by their respective pressure roll 5. For raising them in the direction of the arrow 30, the rub-out bars 3 and 4 are lifted together with their respective pressure roll 5, with the aid of the respective mounting angle 29 which is firmly connected to its respective rub-out bar 3 or 4. The constructional design of the mounting angle 29 is such that the oscillating movement of the rub-out bars is not impeded.

For cleaning the device, the individual angle levers 9, 12, with their respective weights 10 are removed from the arrangement by tilting them away upwardly, around the fulcrum 13 and in the direction of the arrow 14, so that they come to rest in a stable position. Then the splash guards 23 which are installed laterally between the ends of the pair of feeding rolls 1 and the pair of squeezing rolls 2 are removed. Then, the lifting devices 16 which are attached to the roll shaft 21 by means of their respective bearings 17 are lifted out.

When cleaning is to be carried out in the case of the embodiment shown in FIG. 3, it is additionally necessary to shift the mounting angle 29 and its fixture in the direction of the arrow 31, in order to make it possible to tilt the angle lever 9, 12 with the pressure roll 5 upwardly, in the direction of the arrow 14.

It will be obvious to those skilled in the art that many modifications may be made within the scope of the present invention without departing from the spirit thereof, and the invention includes all such modifications.

What I claim is:

1. In a device for uniformly pressing on and releasing the pressure from, particularly oscillating, rub-out bars in an apparatus for developing printing plates including transport rolls and, if appropriate, squeezing rolls arranged in pairs, particularly in a horizontal position, with a bearing at each end of each upper roll, and means whereby each bearing and upper roll may be raised and lowered with respect to each lower roll, the improvement comprising pivotal angle lever means, equipped with weight means, and having a lower arm with a pressure roll connected to the end thereof, said pressure roll being adapted to exert pressure on a rub-out bar in the lowered position of said each upper roll, and lifting means for said angle lever means comprising bearing means adapted to seat on shaft means of said upper rolls, and connecting means between said bearing means and an upper arm of said pivotal angle lever means.

2. A device according to claim 1 in which said rub-out bars include at least one brush bar or plush bar.

3. A device according to claim 1 in which said pressure roll, connected to said lower arm, contacts said rub-out bar in the lowered position of said each upper roll, and is separated from said rub-out bar by a small gap in the raised position of said each upper roll.

4. A device according to claim 1 including mounting angle means securing said pressure roll to an associated rub-out bar.

* * * * *